United States Patent
Oldendorf et al.

[11] Patent Number: 6,166,324
[45] Date of Patent: Dec. 26, 2000

[54] PC CARD HOUSING WITH INSULATIVE COVER AND GROUND FEATURE

[75] Inventors: John Oldendorf, Prospect Heights, Ill.; Brandt Weibezahn, San Ramon; Jeffrey Allen, Plesanton, both of Calif.

[73] Assignee: Methode Electronics, Inc., Chicago, Ill.

[21] Appl. No.: 09/129,907

[22] Filed: Aug. 6, 1998

[51] Int. Cl.[7] .................................................. H05K 9/00
[52] U.S. Cl. .................. 174/35 R; 174/52.1; 174/51; 174/35 MS; 361/753; 361/752; 361/757; 361/818; 361/800
[58] Field of Search .................. 174/52.1, 35 R, 174/51, 35 MS; 361/753, 752, 757, 818, 800

[56] References Cited

U.S. PATENT DOCUMENTS

| | | | |
|---|---|---|---|
| Re. 35,873 | 8/1998 | Simmons et al. | 361/818 |
| 5,038,250 | 8/1991 | Uenaka et al. | 361/395 |
| 5,187,642 | 2/1993 | Carner et al. | 361/386 |
| 5,339,222 | 8/1994 | Simmons et al. | 361/818 |
| 5,397,857 | 3/1995 | Farqquhar et al. | 174/52.1 |
| 5,425,646 | 6/1995 | Green | 439/79 |
| 5,476,387 | 12/1995 | Ramey et al. | 439/76.1 |
| 5,574,628 | 11/1996 | Persia et al. | 361/737 |
| 5,627,729 | 5/1997 | Oldendorf et al. | 361/737 |
| 5,749,741 | 5/1998 | Bellas et al. | 439/95 |
| 5,886,402 | 3/1999 | Onoda et al. | 257/679 |

Primary Examiner—William A. Cuchlinski, Jr.
Assistant Examiner—Ronnie Mancho
Attorney, Agent, or Firm—Karl D. Kovach; David L. Newman

[57] ABSTRACT

A card housing for printed circuit boards, wherein the card housing is provided with stamped covers having grounding members extending unitarily therefrom, wherein at least one grounding member is bent so that an outward surface of the grounding member is contiguous with an outward face of the cover. The cover having the bent grounding member is stamped from a metallic sheet having an insulative frame on one side that forms the outward face and surface. An insulative frame overlays a peripheral edge of each cover so that the two covers may be sealed to encase a printed circuit board inserted therein.

24 Claims, 5 Drawing Sheets

PC CARD HOUSING WITH INSULATIVE COVER AND GROUND FEATURE

BACKGROUND OF THE INVENTION

1. Field of the Invention

This invention pertains to card housings for printed circuit boards, and more specifically, to card housings having an insulative cover and ground feature that facilitates and enhances the ability to manufacture and assemble card housings.

2. Discussion of the Background

Cards encasing printed circuit boards ("PCB"), generally referred to as "PC cards", are widely employed devices that expand the versatility and capacity of computer processing units, most notably in laptop and palm sized computers. Examples of PC cards include memory cards, which serve to expand or diversify the memory capacity of the CPU. Still, other types of PC cards enhance the I/O functions of the CPU by providing communication capabilities for fax-modems and peripheral devices.

Industry standards for promoting uniform specification and design of some PC cards is promulgated by the Personal Computer Card International Association (PCMCIA), and alternatively, in Japan by the Japan Electronic Industry Development Association (JEIDA). PCMCIA cards are commonly differentiated into three formats known as Type I, II, or III. All three formats have identical rectangular dimensions, but differ in the respective thickness. Type I cards have a uniform thickness of 3.3 mm, Type II cards are approximately 5.0 mm thick with 3.3 mm thick edges, and Type III cards are approximately 10.5 mm thick with 3.3 mm thick outside edges. Still, other types of PC cards exist, including Compact Flash cards and miniature cards, as manufactured and employed by the Intel Corporation and others.

In basic form, PC cards are rectangular, with lateral sides and a front end and a back end, and comprise a pair of opposing metallic covers and a plastic frame surrounding a printed circuit board. The metallic covers are usually stamped to conform to the desired specifications. As practiced in the art, the plastic frame is injection molded to each cover, and the two halves are joined to form the whole PC card. The printed circuit board is formed from a planar substrate having one or more electrical components mounted to either side. The front end of the PC card is generally designated to mate with the host computer. For PCMCIA cards, the host connector is female and provides for 68 pins. The back end may provide for switches, I/O connectors, extensions providing I/O connectors, RJ plug receivers, or other features.

One feature generally included in PC cards is a ground element that acts as a circuit ground for the circuit board engaged with the host or peripheral connector. The ground element may also be required to provide a chassis ground for remedying the build up of electrostatic charge and electromagnetic interference inherently created by the electrical components contained within the card. The prior art provides several designs for PC cards that employ various ground elements. In particular, U.S. Pat. No. 5,187,642 to Garner et al. discloses metal rails that attach to the integrated circuit substrates on both lateral sides of the circuit boards. U.S. Pat. No. 4,725,920 to Ijichi et al. discloses a separate grounding plate sandwiched between two printed circuit substrates. U.S. Pat. No. 5,749,741 to Bellas et al. provides for grounding clips that are mounted to, or otherwise electrically connected to, a terminal that is mated with the planar substrate. These and other references not mentioned herein provide for the grounding element as an extra component interconnected to the PC card.

The increased demand for PC cards has created the need for simpler and more efficient incorporation of a ground element within the PC card. A more efficient method of providing a ground element is to employ the two stamped metallic covers as a grounding feature of the PC card, as disclosed by U.S. Pat. No. 5,544,007 to Inoue. Inoue provides alternative grounding elements, including conductive portions that extends from each stamped cover to contact one another when the covers are joined, where the conductive elements combine with a ground spring between the substrate and the cover to ground the whole PC card. However, Inoue requires that the stamped covers be formed entirely of conductive material.

The modular appeal of PC cards and their widespread popularity has created the need for PC cards having customized features that enhance physical and aesthetic characteristics of the PC card. For example, color-coded covers may be employed to designate a particular function or manufacturer of the PC card. According to the related art, coloring or designing the external surface of the PC card is preferably accomplished by way of insulative coats made of plastic or paint. In addition, PC card housings may be customized to provide a particular external tactile surface, or to provide for an external insulative plastic coating. Such external customizations generally must be incorporated into the PC card housing in one of two ways. First, the covers may be formed from insulative material, with an extra grounding member contained therein that is isolated from the stamped covers. However, the additional ground feature is an additional feature that must be integrated between the housing and the printed circuit board, thereby adding manufacturing and labor cost to the overall cost. Second, and alternatively, the grounding element may be stamped with the covers, and an additional decorative insulative coat may be applied to the exterior of the PC card housing as an additional step. Post-assembly application of decorative insulative coats to the covers is also costly, and requires additional equipment and manufacturing capabilities.

It is therefore an object of the invention to provide for a PC card having stamped metal covers with a grounding element unitarily incorporated therein.

Another object of the invention is to provide a ground feature on a PC card housing that acts as a circuit ground and/or a chassis ground.

Still another object of the invention is to provide a PC card manufactured by pre-customized stamped metal covers, each of which provide a customized external surface.

SUMMARY OF THE INVENTION

A card housing for a PCB is provided having a grounding member that may be stamped as a portion of a cover on the card housing. The grounding member is bent to allow the cover with grounding member to be formed from a single metallic sheet having pre-coated insulative material on one side. Stamping the cover from pre-coated insulative material allows for efficient incorporation of a grounding member within a card housing having decorative, marked, or tactilely oriented features.

In more detail, the card housing of this invention comprises a first cover and a second cover, where each cover has an outward and inward face with opposing lateral sides and a front end and a back end. A peripheral edge is defined by the inward and outward face on each cover. Each cover includes a grounding member extending unitarily therefrom so that the grounding member and cover are one piece. The first grounding member is preferably bent to have an outward surface that is contiguous with the outward face of the first cover. Likewise, the first grounding member has an inward surface that is contiguous with the inward face. The second grounding member may be bent and shaped as the first grounding member to extend unitarily from the second cover. Each cover with grounding member may be stamped from a metallic sheet having an insulative surface on one side and a conductive surface on another side, so that the insulative surface forms the outward face of the first cover and the outward surface of the first grounding member. A first and second insulative frame is molded about a peripheral edge of the respective first and second cover. In this way, the first and second covers may be sealed along the respective peripheral edges having the insulative frames molded thereon so that the first and second grounding members contact one another.

A method for forming the aforementioned card housing is provided having the step of stamping a first cover with a first bent grounding member from a metallic sheet having an insulative side and a conductive side, wherein the insulative side forms the outward face of the first cover and the outward surface of the first grounding member, and the conductive side forms the corresponding inward face of the first cover and inward surface of the first grounding member. The outward surface of the grounding member is contiguous with the outward face of the first cover, and the inward surface is contiguous with the inward face. The method further comprises stamping a second cover having a second grounding member extending therefrom, and molding a first and second insulative frame onto the peripheral edge of the respective first and second cover. The method further comprises sealing the first and second covers along the respective peripheral edges having the respective first and second insulative frames molded thereon so that the first and second grounding members contact one another.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PRESENTLY PREFERRED EMBODIMENTS

Figure 1:
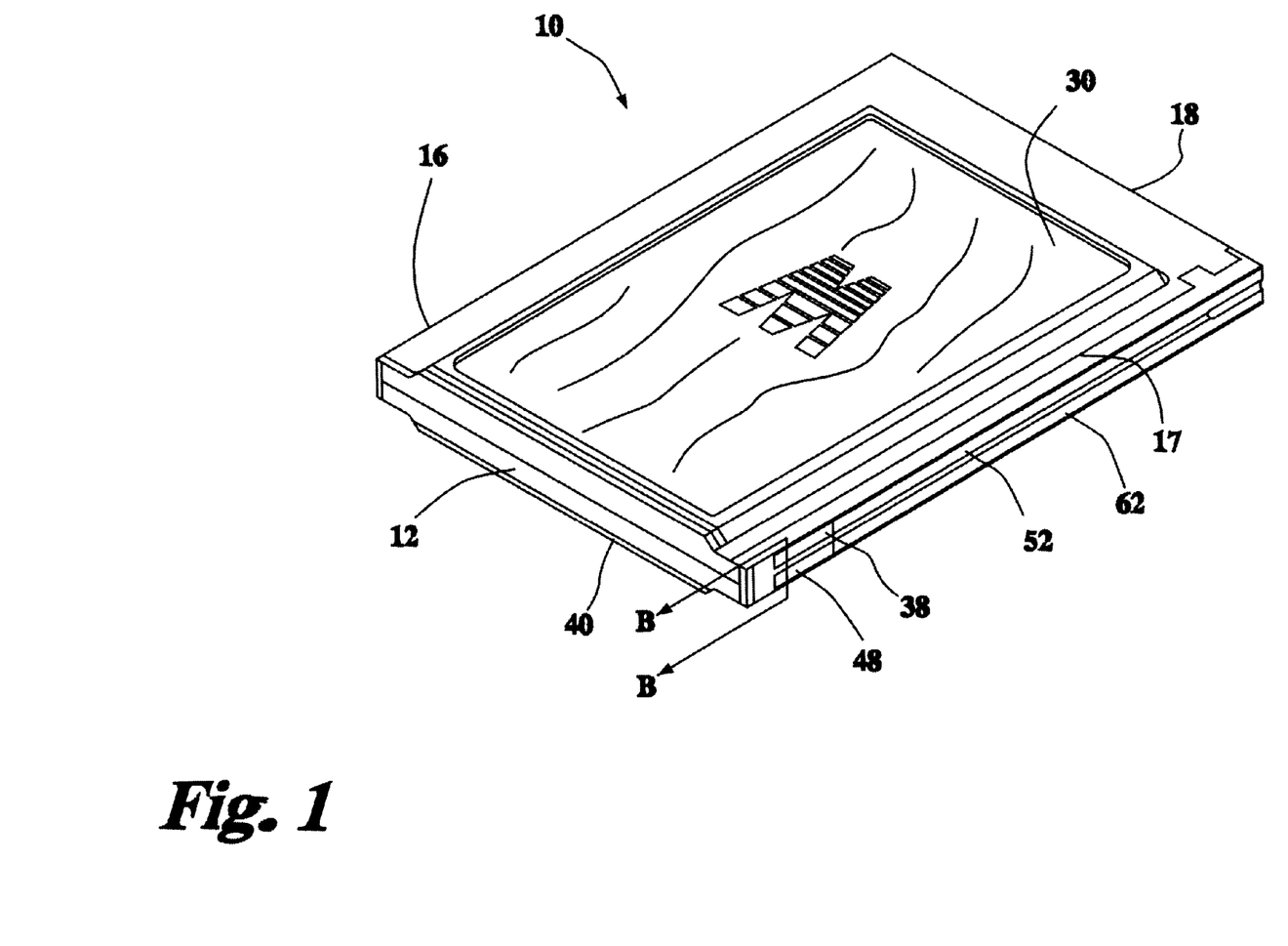
FIG. 1 is a perspective view of a back end of an assembled card housing of the invention showing a marked cover.

With reference now to the drawings, FIG. 1 is a perspective view of an assembled PCB card housing 10 encompassed by this invention. In general, the PCB card housing 10 is rectangular in shape and may be referenced with respect to front and back ends 18 and 12 respectively, and opposing lateral sides 16 and 17. The card housing 10 illustrated in FIG. 1 conforms to a Type II PCMCIA card, but Type I or Type III or other known PC card designs may also be employed with this invention. Card housings intended to be encompassed by this invention also include "Mini-cards" and "CompactFlash cards". The card housing 10 includes top and bottom covers 30 and 40 (shown in FIG. 5) which encase a printed circuit board (not shown) inserted therein. As will be described in detail below, a pair of top and bottom grounding members (shown as numerals 35 and 45 in FIG. 2) provide corresponding grounding surfaces 38 and 48 that are flush with the lateral sides 16, 17 of the assembled card housing 10. Top and bottom insulative frames 52 and 62 (FIG. 5) are insert molded to provide a connective and insulative surface between the top and bottom covers 30 and 40. The insulative frames 52, 62 form lateral sides 16, 17 that surround the grounding members 35 and 45 so that the grounding surfaces 38 and 48 are exposed on the lateral sides 16 and 17. As will be described in further detail, this invention also allows for either one or both of the covers 30, 40 to be stamped from metallic sheets having an insulative outer surface and a conductive inner surface. Accordingly, one advantage of the preferred embodiment, as shown by FIG. 1, is that the top cover 30 may be decorative or otherwise marked for identification of its manufacturer or function while still providing a conductive surface and the grounding surfaces 38 and 48.

Figure 2:
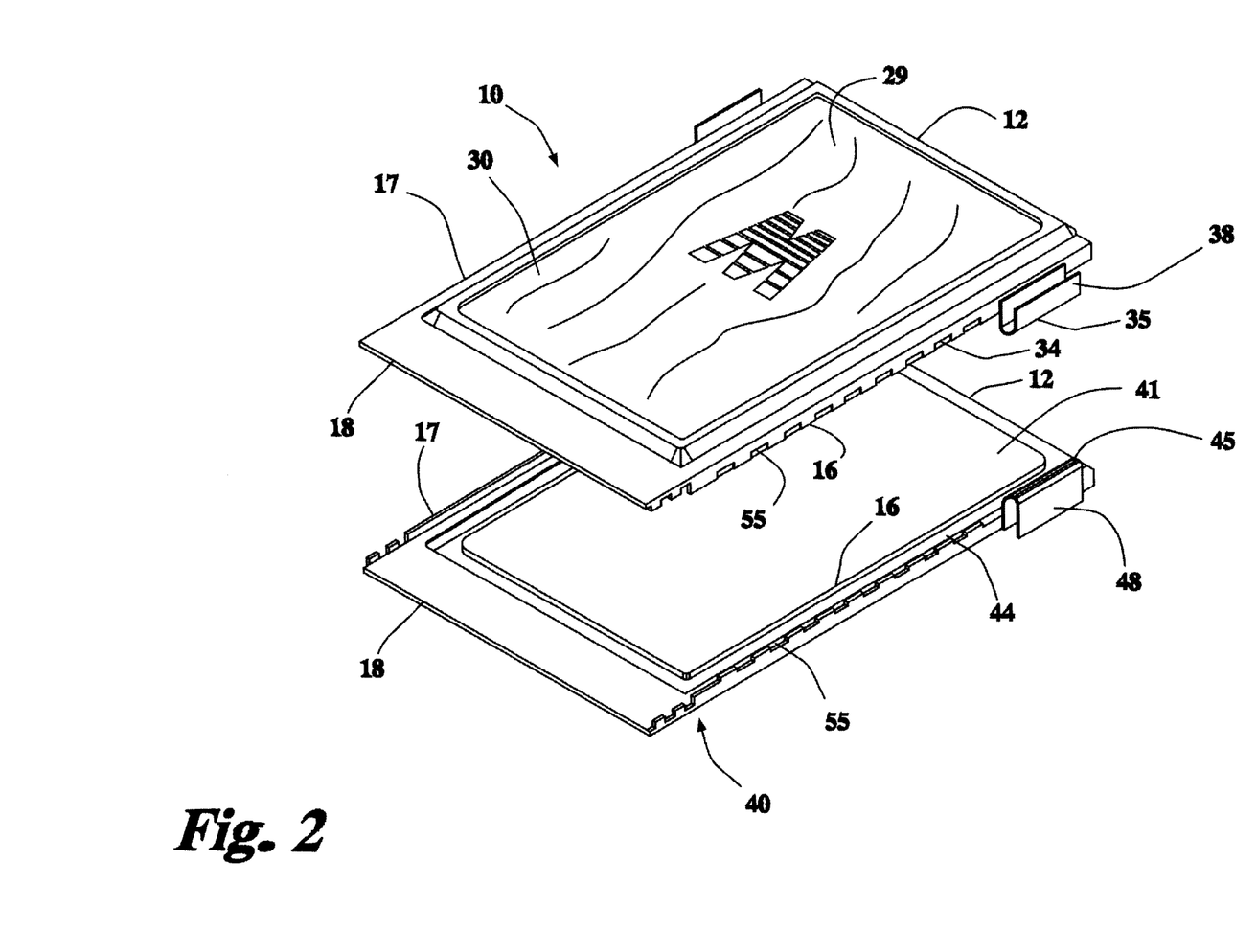
FIG. 2 is a perspective view of a front end of the top and bottom covers of the card housing without frames.

FIG. 2 is a perspective of the top and bottom stamped covers 30 and 40, viewed from the front end 18. The top cover 30 may be referenced with respect to an outward face 29 and an inward face 31 (FIG. 5) that combine to define a peripheral edge 34. The bottom cover 40 preferably mirrors the top cover 30 and, likewise, has an outward face 39 (FIG. 5) and an inward face 41 which combine to define a peripheral edge 44. The preferred embodiment includes a pair of grounding members extending unitarily from each cover, with the top cover 30 having grounding members 35, 35 on lateral sides 16 and 17. Likewise, a pair of bottom grounding members 45, 45 are aligned on lateral sides 16 and 17 to contact the corresponding top grounding members 35, 35. The ground members 35, 45 of this invention are bent to extend into multiple planes. While the preferred embodiment has four bent grounding members positioned on each lateral side of the top and bottom cover 30 and 40, this invention anticipates multiple orientations, locations, or numbers of grounding members not shown in the drawings. Thus, this invention may alternatively be practiced with only two bent grounding members. One grounding member located at one corner of the top cover and a second grounding member located at one corner of the cover respectively.

In a preferred embodiment, either one, or both, of the covers 30 and 40 are stamped from a metallic sheet comprising an outer surface pre-coated or integrated with insulative material, and an inner surface conductive to electricity. Once stamped, the outer surface of the metallic sheet forms the visible top and bottom outward faces 29 and 39 (FIG. 5), while the conductive side of the metallic sheet forms the conductive top and bottom inward faces 31 and 41. In this manner, the top and/or bottom inward faces contact a ground associated with the inserted printed circuit board (not shown). The conductive top and bottom inward faces 31 and 41 extend the electrical contact to the grounding members 35 and 45, which in turn ground the printed circuit board. The insulative coat of the outward surface may include colored plastic, paint, vinyl, or tactile shaped material. The preferred embodiment employs metallic sheets manufactured by American Nickeloid, such as BKU-254 (black coat).

FIG. 2 also shows that the top and bottom covers 30 and 40 are stamped to include lateral protrusions 55 that merge with the lateral sides 16 and 17 and extend outward therefrom. As will be further described, the protrusions serve to retain the top and bottom insulative frames 52 and 62 along the lateral sides 16 and 17. The insulative frames 52 and 62 are flush with the grounding surfaces 38, 48 of the corresponding grounding members 35, 45 so that only the grounding surfaces are exposed.

Figures 3, 4:
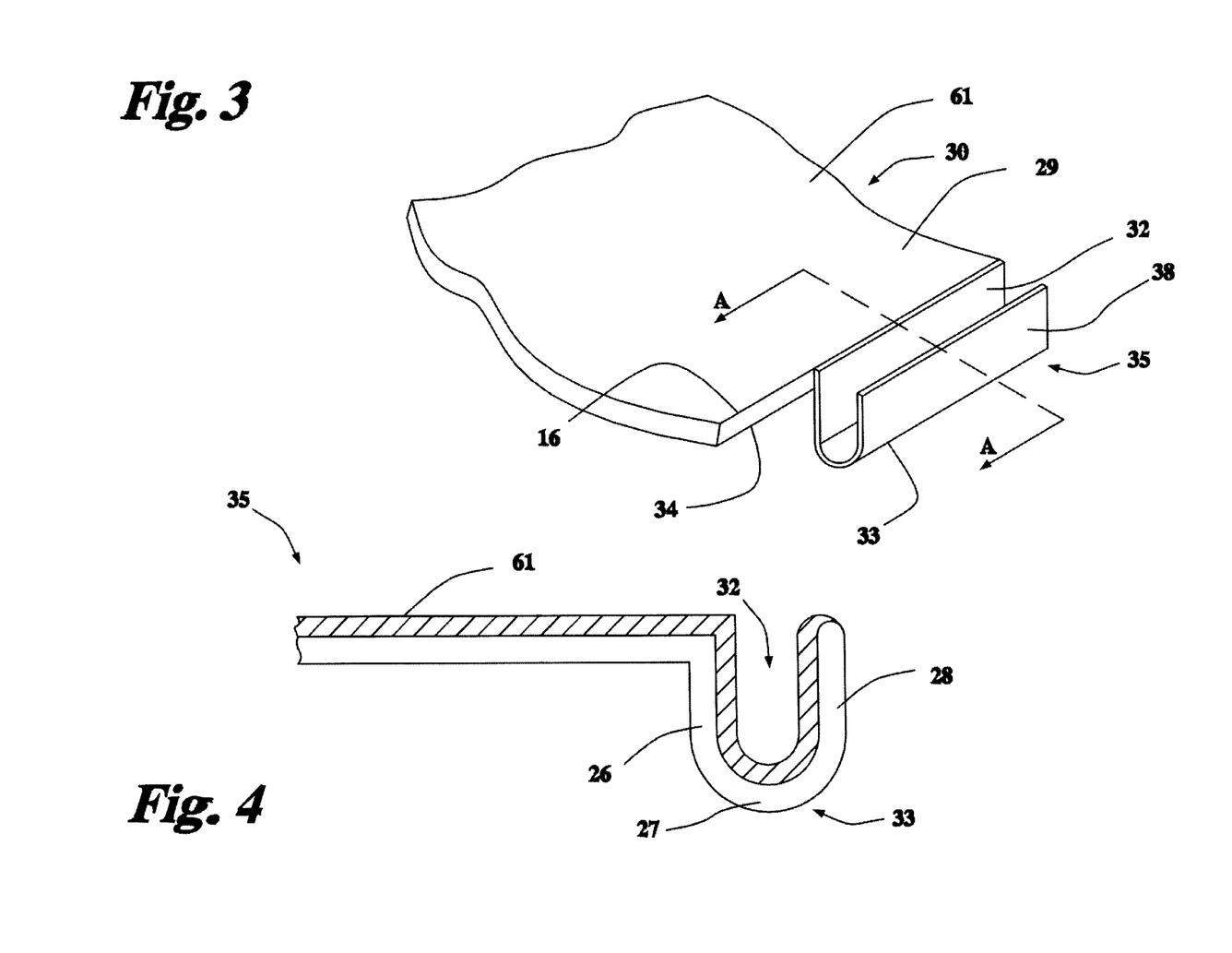
FIG. 3 is an enlarged perspective view of the grounding member and a section of the cover of the preferred embodiment.
FIG. 4 is a cross-sectional view of the grounding member shown in FIG. 3, taken along section line A—A.

With reference to FIG. 3, the top grounding member 35 is shown in an enlarged view and is representative of the other grounding members employed herein and will be described in greater detail. The top grounding member 35 extends unitarily from the corresponding lateral side 16 of cover 30. As shown, the top grounding member 35 is bent in a u-shape, and provides an outward and inward surface 32 and 33 (see FIG. 4). The outward surface 32 of the u-shape has a concave portion. The bent shape allows the grounding member 35 to make conductive contact with another grounding member from an adjacently placed cover along the inward surface 33. The outward surface 32 is contiguous with the outward face 29 of the top cover, and the inward surface 33 is contiguous with the top inward face 31 (shown in FIG. 5). In the preferred embodiment, the grounding member 35 is shaped so that the grounding surface 38 is formed on the inward surface 33 along the lateral side 16. As will be described in further detail, the insulative frame 52 (FIG. 5) may be molded around the peripheral edge 34 and overlaid on the outward surface 32 of the grounding member 35 to make flush the grounding surface 38 with the lateral side 16. It should be noted that when the card housing 10 is fully assembled, all surfaces of the ground member 35, except grounding surface 38 and a mating surface 27 (FIG. 4) are covered by the insert molded insulative frame 52, thereby filling in the u-shaped outward surface 32 as shown in FIG. 6. FIG. 6 is a cross-sectional view of FIG. 1 taken along section line B—B showing the grounding member of FIG. 4 attached to the frame.

FIG. 4 is a cross-sectional view taken along section line A—A of FIG. 3 and shows that the grounding member 35 is generally u-shaped, with two vertical portions 26 and 28 form planes substantially normal to a plane defined by the lateral sides 16 and 17 (FIG. 1 which is a plane that is substantially parallel to a plane formed by the surface 29 of the cover 30). The first and second vertical portions 26, 28 each extend inward and bend into a mating surface 27, such that the grounding surface 38 (FIG. 3) is formed on the inner surface of the second vertical portion 28 (FIG. 3). As shown, the mating surface 27 in combination with the first and second vertical portions 26, 28 form a concave portion. FIG. 4 also shows that the cover 30 includes an insulative layer 61, which is stamped from a metallic sheet having one side made of the insulative layer.

One principal advantage of the present invention is that the grounding member 35 may be stamped as a unitary feature of the covers, even when the covers are stamped from metallic sheets having an insulative coat on one side. The outward concave orientation of the bent grounding member provides for the insulative layer or coat of the metallic sheets to be contained within the confines of the vertical portions 26 and 28 and mating surface 27. As such, the inward surface 33 of the grounding member 35 is formed from the conductive side of the metallic sheets and is oriented to extend inward to make electrical contact with another ground element. The preferred embodiment provides an identical bottom grounding member 45 (FIG. 2) having an inward and outward surface 43 and 42. Similar to the first grounding member 35, the outward surface 42 of the second grounding member 45 includes a concave portion. The preferred bottom grounding member 45 is oriented in the opposite direction, so as to extend the inward surface 43 towards the top grounding member 35. It should be apparent to one skilled in the art that the top and bottom covers 30 and 40 may be stamped to be interchangeable while providing for the bent grounding members 35 and 45 as described.

Figure 5:
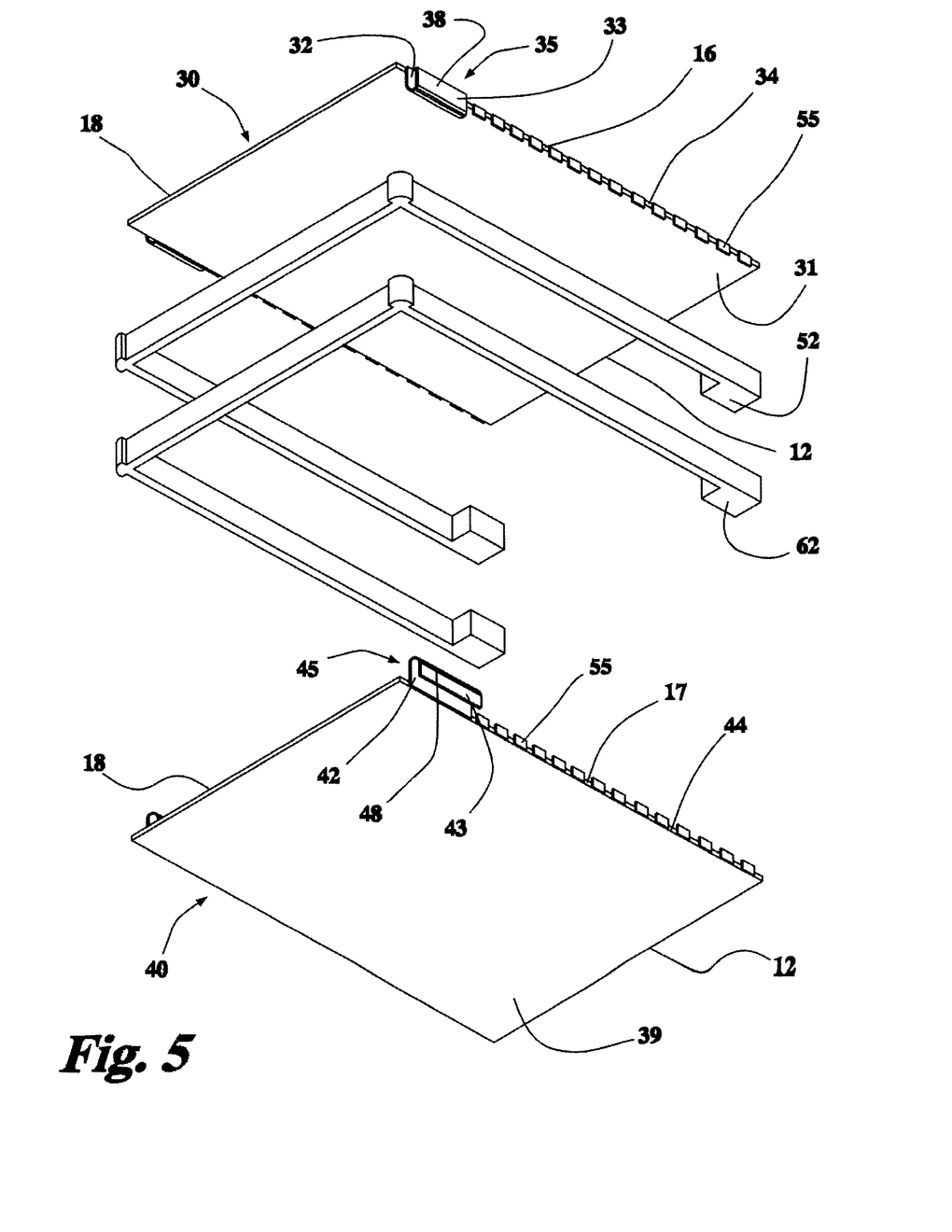
FIG. 5 is a bottom perspective exploded view of the card housing.
Figure 6:
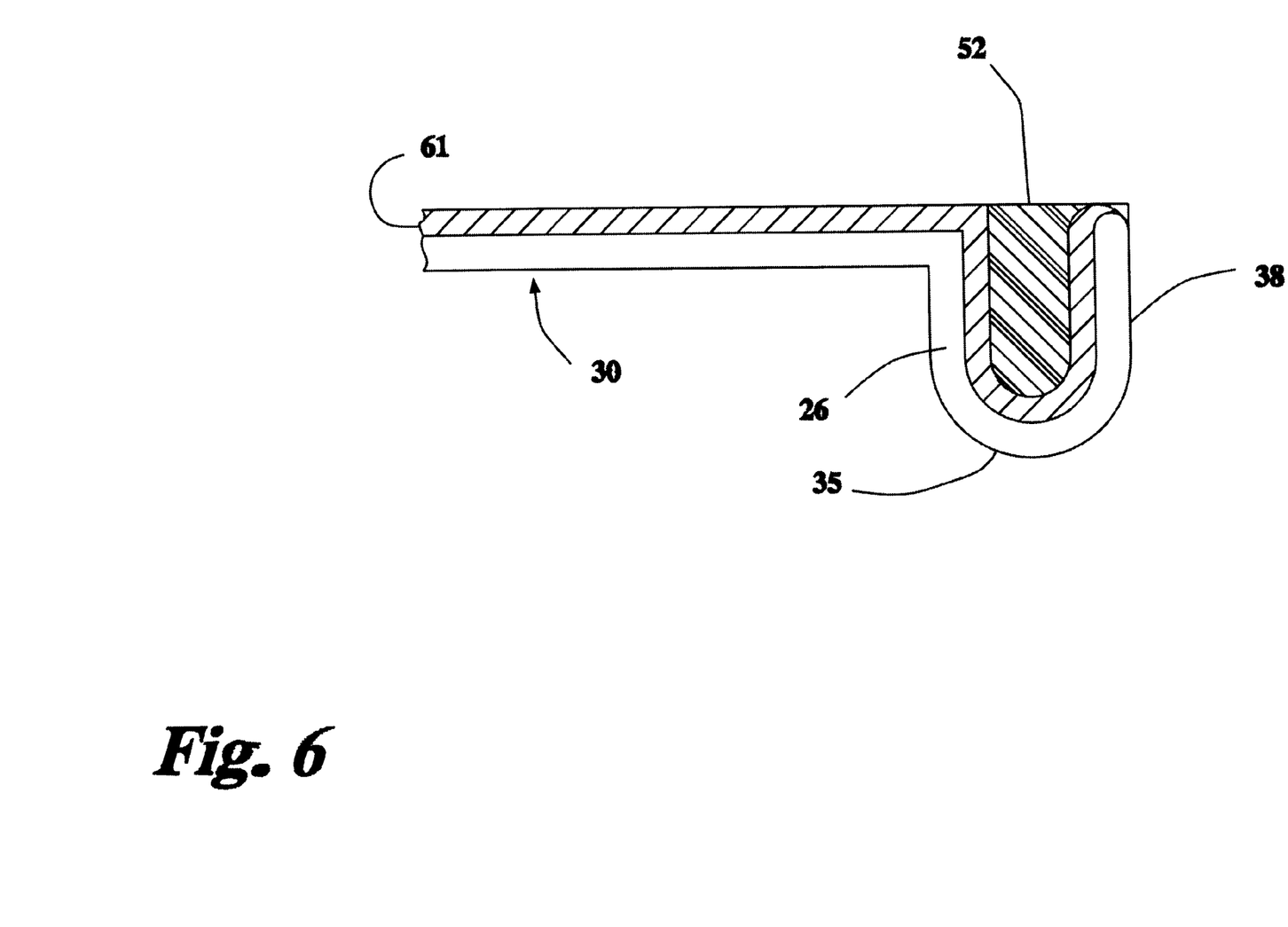
FIG. 6 is a cross-sectional view of the grounding member and frame shown in FIG. 1, taken along section line B—B.

With reference to FIG. 5, the covers 30 and 40 are shown to be combined with the top and bottom insulative frames 52 and 62 to form a complete card housing. FIG. 5 shows that the grounding members 35, 45 may alternatively be positioned near the front end 18, as opposed to the back end 12. The insulative frames 52 and 62 are preferable comprised of plastic, which may be insert molded onto the respective covers using injection insert mold machines known in the art.

It should be noted that FIG. 5 does not depict the insulative frames 52 and 62 as being insert molded, but rather pre-formed frames shaped to provide a recess that accommodates the grounding members 35, 45. This alternative insulative frame may be attached to a respective cover through attachment means known in the art. U.S. Pat. No. 5,476,387 to Ramey (hereinafter "Ramey") is hereby incorporated herein by reference, as it shows the alternative preferred insulative frame being attached to covers of a similar card housing 10. In FIGS. 1 and 4 of Ramey, a tab is provided as shown by numeral 21. The tab serves to attach the corresponding cover to the pre-formed insulative frame. Recesses 21 are provided on the insulative frame to accommodate the tabs and thereby form an attachment means between the frame and the cover.

The top and bottom insulative frames 52 and 62 are preferably molded on the peripheral edges 34 and 44 of the top and bottom covers 30 and 40 respectively. The top and bottom insulative frames 52 and 62 then provide a connective surface for attaching or sealing the two covers into the complete card housing 10. In the preferred embodiment, the covers 30 and 40 are bonded, via the insulative frames 52, 62, using sonic bonding techniques, as disclosed by U.S. Pat. No. 5,397,857 which is hereby incorporated herein by reference. The protrusions 55 of the covers serve to support the insulative frames 52 and 62. The insulative frames must extend laterally to surround the bent grounding members 35 and 45 so that only the grounding surfaces 38 and 48 are exposed. Preferably, the protrusions extend in planar fashion from the respective top or bottom covers 30, 40. The insert molding process provides recesses on the insulative frames 52 and 62 to accommodate the respective bent grounding members 35 and 45 so as to overlay the outward surface 32, 42 of each grounding member 35,45. The insert molding process leaves the grounding surface 38 and inward surface 33 uncovered. In the preferred embodiment, the top and bottom cover 30 and 40 are bonded by sonically welding the top and bottom insulative frames 52 and 62.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

What is claimed is:

1. A card housing for encasing a printed circuit board comprising:

a first cover and a second cover, each of the first cover and the second cover having an outward face and an inward face with a pair of opposing lateral sides, and a front end and a back end and a peripheral edge defined by the outward and inward faces;

said first cover including a bent first grounding member extending unitarily therefrom, the first grounding member having an outward surface contiguous with the outward face of the first cover, and an inward surface contiguous with the inward face of the first cover, and wherein the bent first grounding member has a concave portion formed on the outward surface;

said second cover including a second grounding member extending unitarily therefrom and aligned with the bent first grounding member;

wherein said first cover is stamped from a metallic sheet having an insulative surface on one side and a conductive surface on another side, said insulative surface forming the outward face of the first cover and the outward surface of the first grounding member;

a first insulative frame and a second insulative frame molded to the respective first and second covers, each of the first and second insulative frames molded about a portion of the peripheral edge of the respective first and second covers; and wherein the first and second covers are engaged, via the respective first and second insulative frames, along the respective peripheral edges having the respective first and second insulative frames abutting each other so that the first and second grounding members contact one another.

2. The card housing of claim 1 wherein said second cover is stamped from a metallic sheet having an insulative surface on one side and a conductive surface on another side, said insulative surface forming the outward face of the second cover and an outward surface of the second grounding member.

3. The card housing of claim 2 wherein the second grounding member is bent and includes the outward surface contiguous with the outward face of the second cover, and an inward surface contiguous and adjacent with the inward face of the second cover, and wherein the second grounding member has a concave portion formed on the outward surface.

4. The card housing of claim 3 wherein the first and second grounding members are u-shaped and extend beyond a plane defined by the pair of opposing lateral sides of the respective first and second covers.

5. The card housing of claim 4 wherein:

the first and second insulative frames are injection molded into the respective first and second covers to overlay a portion of the corresponding peripheral edges; and wherein the first and second insulative frames are sonically welded to one another.

6. The card housing of claim 1, wherein the insulative surface of the metallic sheet is plastic.

7. The card housing of claim 1, wherein the insulative surface of the metallic sheet is a colored coat.

8. The card housing of claim 1, wherein the insulative surface of the metallic sheet is tactile shaped.

9. The card housing of claim 5, wherein the first and second covers include protrusions merged with the lateral sides and extending therefrom in a substantially planar direction to support the insulative frames molded thereon.

10. A card housing for encasing a printed circuit board comprising:

a first cover and a second cover, each of the first cover and the second cover having an outward face and an inward face with a pair of opposing lateral sides and a front end and a back end and a peripheral edge defined by the outward and inward faces;

said first cover including a first grounding member extending unitarily therefrom and being in multiple planes, the first grounding member having an outward surface contiguous with the outward face of the first cover, and an inward surface contiguous with the inward face of the first cover, and wherein the first grounding member has a concave portion formed on the outward surface;

said second cover including a second grounding member extending unitarily therefrom and aligned with the first grounding member, the second grounding member being bent and having an outward surface contiguous with the outward face of the second cover, and an inward surface contiguous with the inward face of the second cover, and wherein the second grounding member has a concave portion formed on the outward surface;

a first insulative frame and a second insulative frame molded to the respective first and second covers, each insulative frame molded about a portion of the peripheral edge of the respective first and second covers so that the first and second grounding members are exposed at the respective lateral side of the corresponding first and second covers; and wherein the first and second insulative frames are sonically welded together so that the first and second grounding members contact one another.

11. The card housing of claim 10 wherein the first and second grounding members each include a pair of vertical members normal to a plane defined by the lateral sides, and a connecting member in between, wherein the vertical and connecting members are unitarily joined to form the respective grounding member.

12. The card housing of claim 10, wherein the first and second covers include outward protrusions merged with the lateral sides and extending therefrom in a substantially planar direction to support the respective insulative frames molded thereon.

13. The card housing of claim 10 wherein said first cover is stamped from a metallic sheet having an insulative surface on one side and a conductive surface on another side, said insulative surface forming the outward face of the first cover and the outward surface of the first grounding member.

14. The card housing of claim 13 wherein the insulative surface of the metallic sheet is plastic.

15. The card housing of claim 13 wherein the insulative surface of the metallic sheet is a colored coat.

16. A card assembly for encasing a printed circuit board comprising:

a first cover having a first insulative frame along a peripheral edge, the first insulative frame having a recess from which a first grounding member is exposed, the first grounding member being unitary with the first cover, the first cover having an outward face and an inward face that define the peripheral edge, the first cover stamped from a metallic sheet having an insulative surface on one side that corresponds to the outward face, the first grounding member having an outward surface contiguous with the outward face of the first cover, and an inward surface contiguous with the inward face of the first cover, and wherein the first grounding member has a concave portion formed on the outward surface; and a second cover attached to the first cover.

17. The card assembly of claim 16 wherein the first grounding member provides a chassis ground that discharges static from the card assembly.

18. The card assembly of claim 16 wherein the first grounding member abuts a second grounding member in order to form a circuit ground that provides the first and second covers at approximately the same ground potential.

19. The card assembly of claim 16 wherein the first insulative frame is attached to the first cover via tabs on the first cover that grasp the first insulative frame.

20. The card assembly of claim 16 wherein the first insulative frame is insert molded to the first cover.

21. The card assembly of claim 16 wherein the second cover has a second insulative frame along a peripheral edge, the second grounding member being unitary with the second cover, the second cover having an outward face and an inward face that define the peripheral edge, the second cover stamped from a metallic sheet having an insulative surface on one side that corresponds to the outward face, the second grounding member having an outward surface contiguous with the outward face of the second cover, and an inward surface contiguous with the inward face of the second cover, and wherein the second grounding member has a concave portion formed on the outward surface.

22. The card assembly of claim 21 wherein the first and second grounding members are bent to extend into multiple planes.

23. The card assembly of claim 16 wherein the insulative surface of the metallic sheet is plastic.

24. The card assembly of claim 16 wherein the insulative surface of the metallic sheet is a colored coat.

* * * * *